United States Patent
Lee

(10) Patent No.: US 7,592,744 B2
(45) Date of Patent: Sep. 22, 2009

(54) METHOD FOR IMPROVING COLOR-SHIFT OF SERIALLY CONNECTED ORGANIC ELECTROLUMINESCENCE DEVICE

(75) Inventor: Chung-Chun Lee, Lunbei Township, Yunlin County (TW)

(73) Assignee: Au Optronics Corp., Hsin-Chu (TW)

( * ) Notice: Subject to any disclaimer, the term of this patent is extended or adjusted under 35 U.S.C. 154(b) by 692 days.

(21) Appl. No.: 11/281,380

(22) Filed: Nov. 18, 2005

(65) Prior Publication Data

US 2006/0284552 A1 Dec. 21, 2006

(30) Foreign Application Priority Data

Jun. 16, 2005 (TW) .............. 94120064 A

(51) Int. Cl.
*H01J 1/62* (2006.01)
*H01J 63/04* (2006.01)
(52) U.S. Cl. ................. 313/504; 313/506; 445/24
(58) Field of Classification Search ......... 313/498–512; 445/24
See application file for complete search history.

(56) References Cited

U.S. PATENT DOCUMENTS

| | | | | |
|---|---|---|---|---|
| 5,703,436 | A * | 12/1997 | Forrest et al. | 313/506 |
| 6,274,980 | B1 * | 8/2001 | Burrows et al. | 313/506 |
| 6,337,492 | B1 * | 1/2002 | Jones et al. | 257/40 |
| 6,717,358 | B1 * | 4/2004 | Liao et al. | 313/504 |
| 6,872,472 | B2 * | 3/2005 | Liao et al. | 428/690 |
| 7,075,231 | B1 * | 7/2006 | Liao et al. | 313/506 |
| 7,126,267 | B2 * | 10/2006 | Liao et al. | 313/500 |
| 7,273,663 | B2 * | 9/2007 | Liao et al. | 428/690 |
| 7,494,722 | B2 * | 2/2009 | Liao et al. | 428/690 |
| 2003/0038594 | A1 | 2/2003 | Seo et al. | |
| 2003/0170491 | A1 * | 9/2003 | Liao et al. | 428/690 |
| 2003/0189401 | A1 * | 10/2003 | Kido et al. | 313/504 |
| 2004/0169461 | A1 * | 9/2004 | Moriyama et al. | 313/503 |
| 2004/0227460 | A1 * | 11/2004 | Liao et al. | 313/506 |
| 2004/0239595 | A1 * | 12/2004 | Vulto et al. | 345/76 |
| 2005/0134174 | A1 | 6/2005 | Shiratori et al. | |
| 2005/0264174 | A1 * | 12/2005 | Liao et al. | 313/500 |
| 2006/0040132 | A1 * | 2/2006 | Liao et al. | 428/690 |
| 2006/0087225 | A1 * | 4/2006 | Liao et al. | 313/504 |
| 2006/0145604 | A1 * | 7/2006 | Liao et al. | 313/506 |
| 2006/0188745 | A1 * | 8/2006 | Liao et al. | 428/690 |
| 2006/0240277 | A1 * | 10/2006 | Hatwar et al. | 428/690 |
| 2006/0244370 | A1 * | 11/2006 | Tyan et al. | 313/506 |

FOREIGN PATENT DOCUMENTS

CN 1433096 A 7/2003

\* cited by examiner

*Primary Examiner*—Bumsuk Won
(74) *Attorney, Agent, or Firm*—Rabin & Berdo, P.C.

(57) ABSTRACT

A serially connected organic electroluminescence device (SC-OELD) comprises the first OELD unit, the second OELD unit and a connecting layer disposed between the first OELD unit and second OELD unit. A method for improving color-shift of the SC-OELD, comprises: determining the color-shift tendencies of the first OELD unit and the second OELD unit, respectively, according to the different currents passing through the first OELD unit and second OELD unit; and combining the first OELD unit and the second OELD unit with the different color-shift tendencies, whereby the different color-shift tendencies of the first OELD unit and the second OELD unit are compensated each other while the electric charge is applied to the SC-OLED, so as to obtain a substantially pure color of the SC-OELD.

11 Claims, 4 Drawing Sheets

METHOD FOR IMPROVING COLOR-SHIFT OF SERIALLY CONNECTED ORGANIC ELECTROLUMINESCENCE DEVICE

This application claims the benefit of Taiwan application Serial No. 094120064, filed Jun. 16, 2005, the subject matter of which is incorporated herein by reference.

BACKGROUND OF THE INVENTION

1. Field of the Invention

The present invention relates in general to a combined method of, making a serially connected organic electroluminescent device and, more particularly, to a method for improving color-shift of the serially connected organic electroluminescent device.

2. Description of the Related Art

Use of organic electroluminescence device (OELD) in the flat panel displays possesses several competitive advantages, such as self illumination, high brightness, wide viewing angle, vivid contrast, quick response, broad range of operating temperature, high luminous efficiency and uncomplicated process of fabrication. Thus, the OELD represents a promising technology for display applications and has receives the worldwide attention in the recent years.

FIG. 1 (related art) illustrates a conventional structure of organic electroluminescence device. The typical structure of OELD 1 is mainly constructed by interposing an organic light emitting layer 15 between an anode (formed on a substrate 10) 11 and a cathode 19. The material of the organic light emitting layer 15 is able to emit light when excited by electric current. A hole transport layer (HTL) 13 is interposed between the anode 11 and the organic light emitting layer 15. Also, a hole injection layer (HIL) (not shown) could be optionally sandwiched between the HTL 13 and the anode 11. An electron transport layer (ETL) 17 is interposed between the cathode 19 and the organic light emitting layer 15. This laminated structure of OELD facilitates the electron flow from the cathode 19 to the anode 11. The organic light emitting layer can be divided into tow groups according to the materials in use. One group is a molecule-based light emitting diode, substantially comprising the dyestuffs or pigments, and so called as "OLED" (i.e. organic light emitting diode) or "OEL" (i.e. organic electroluminescence). The other group is a polymer-based light emitting diode, so called as "PLED" (i.e. polymer light emitting diode) or "LEP" (i.e. light emitting polymer).

The luminance efficiency of a single color OELD has been successfully improved. For the worldwide OELD manufacturers, however, it is the final goal to provide an OELD with full-color emission. The OELD with full-color emission includes replicated pixels, and each pixel is able to emit red, green and blue light.

The smaller the pixel size, the higher resolution the OELD. "Full-color emission" display can be prepared by various methods. The first method is achieved by placing red, green and blue OELDs in a side-by-side configuration within a single pixel, for separately emitting three essential colors (Red, Green, Blue), and any combination thereof. The second method is achieved by a combination of a white light-OELD and a color filter (CF). The third method for providing full-color emission is the use a blue emitter and a color changing media (CCM) (such as a color conversion film). The blue light is converted to green or red by the color-changing media (CCM). The first and second methods are the most direct methods used in the manufacture.

Although optimal light efficiency of an OELD can be achieved by the RGB side-by-side method, it makes the fabrication more complicated that the shadow-masks required for depositing different emitters to create pixels with red, green, and blue subpixels. Also, the color purity and the luminance efficiency are important parameters and need to be well controlled. Besides, the OELD fabricated by the RGB side-by-side method possesses the disadvantages, such as different voltages for driving the RGB sub-pixels being required, color of OELD not contrasted clearly and the difficulty of improving the resolution of OELD. Therefore, researches about the second method for fabricating full-color emission OELD (i.e. white light and CF) become thriving nowadays.

In the second method, a white electroluminescent material is deposited on the substrate, and a color filter is overlaid onto the white emitter array. Light emitted from the white electroluminescent material passes through the color filter to create the red, green, and blue subpixels. The red, green, and blue subpixels are controlled by the different thin film transistors (TFT) to present the colors shown on the display. The second method without the use of shadow-masks simplifies the process, and is the easier way to make a high resolution and clear contrast color OELD. Since the combination of a white electroluminescent material and a color filter does not require precise alignment as rigorous as pixelized OELDs, the production yield can be increased. Many combinations of organic electroluminescent units such as two-element and three-element structures can be used for making a white OELD. The light emitted from the organic electroluminescent units passing through the color filter yields light that appears purer blue, red and green colors. Although the approach of the white electroluminescent material and the color filter does possess many advantages, it is difficult to control the color purity and the resulting white color is generally behind the expectation.

FIG. 2A (related art) shows the electroluminescence (EL) spectra of a conventional OELD with two-element structure. It is assumed that the organic light emitting layer of the conventional OELD having EL spectra of FIG. 2A comprises a blue electroluminescent material and a yellow electroluminescent material, and a hole barrier layer is sandwiched therebetween. An electrical potential is applied between the anode and the cathode to make the OELD produce white light. According to the results of FIG. 2A, the EL spectra of this OELD depend on the electrical potentials. In FIG. 2A, the OELD having higher luminance (in units of $cd/m^2$) is operated by higher electrical potential. Slightly blue white light (i.e. stronger intensity shown in the shorter wavelength) is emitted from the OELD when a low or normal electrical potential is applied between the anode and the cathode. However, slightly yellow white light (i.e. stronger intensity shown in the longer wavelength) is emitted from the OELD when a high electrical potential is applied.

FIG. 2B (related art) shows the electroluminescence (EL) spectra of a conventional OLED with three-element structure. It is assumed that the organic light emitting layer of the conventional OELD having EL spectra of FIG. 2B comprises a yellow electroluminescent material sandwiched between two blue electroluminescent materials. An electrical potential is applied between the anode and the cathode to make the OELD produce white light. According to the results of FIG. 2B, the EL spectra of this OELD depend on the electrical potentials. Similarly, the OELD having higher luminance (in units of $cd/m^2$) of FIG. 2B is operated by higher electrical potential. Contrary to the result of FIG. 2A, slightly yellow white light (i.e. stronger intensity shown in the longer wavelength) is emitted from the OELD of FIG. 2B when a low or normal electrical potential is applied between the anode and the cathode. Slightly blue white light (i.e. stronger intensity shown in the shorter wavelength) is emitted from the OELD of FIG. 2B when a high electrical potential is applied.

Both of the color-shift conditions of FIG. 2A and FIG. 2B causes impure white light, and the light color is behind the expectation. Therefore, "color balance" is one of the important issues in the full-color emission technology achieved by the combination of the white electroluminescent material and the color filter.

SUMMARY OF THE INVENTION

It is therefore an object of the present invention to provide a method for improving color-shift of a serially connected organic electroluminescent device (SC-OELD). Light emitted from the SC-OELD that is fabricated by applying the method of the present invention is able to present a substantial pure color.

The present invention achieves the objects by providing a method for improving color-shift of a serially connected organic electroluminescent device (SC-OELD), wherein the SC-OELD comprises a first OELD unit, a second OELD unit and a connecting layer disposed between the first and the second OELD units. The method comprises the steps of:

determining color-shift tendencies of the first OELD unit and the second OELD unit according to different degree of electric charge passing through the first OELD unit and the second OELD unit;

combining the first OELD unit and the second OELD unit with different color-shift tendencies according to color-shift tendencies of the first OELD unit and the second OELD unit;

obtaining a substantially pure light color while an electric charge is applied to the SC-OELD, whereby the different color-shift tendencies of the first OELD unit and the second OELD unit are compensated each other.

Other objects, features, and advantages of the present invention will become apparent from the following detailed description of the preferred but non-limiting embodiment. The following description is made with reference to the accompanying drawings.

DETAILED DESCRIPTION OF THE INVENTION

In the present invention, a method for improving color-shift of the serially connected organic electroluminescent device (SC-OELD) is disclosed. The different color-shift tendencies of the first OELD unit and the second OELD unit are selected for making the SC-OELD, whereby the different color-shift tendencies of the first OELD unit and the second OELD unit are compensated each other while the electric charge is applied to the SC-OLED, so as to obtain a substantially pure color of the SC-OELD. By applying the present method to a display apparatus, a pure (or almost pure) white color can be emitted from the display apparatus.

Figure 1:
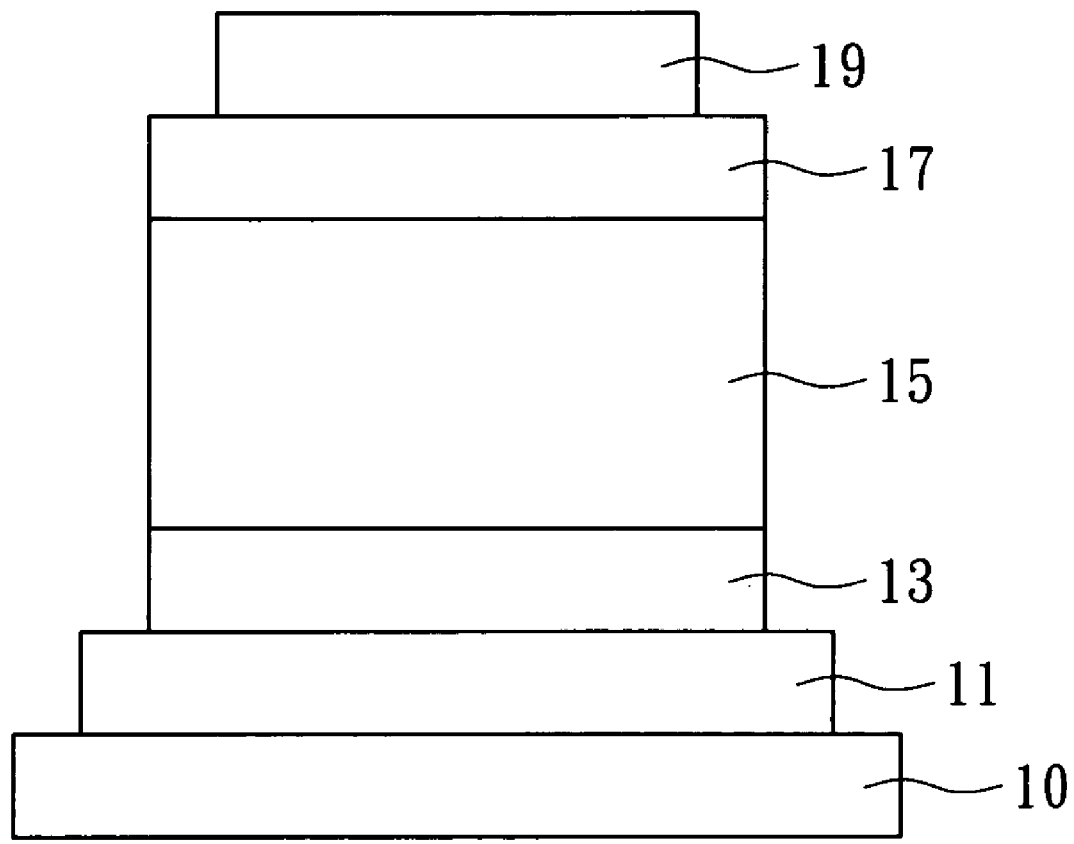
FIG. 1 (related art) illustrates a conventional structure of organic electroluminescence device.
Figure 2A:
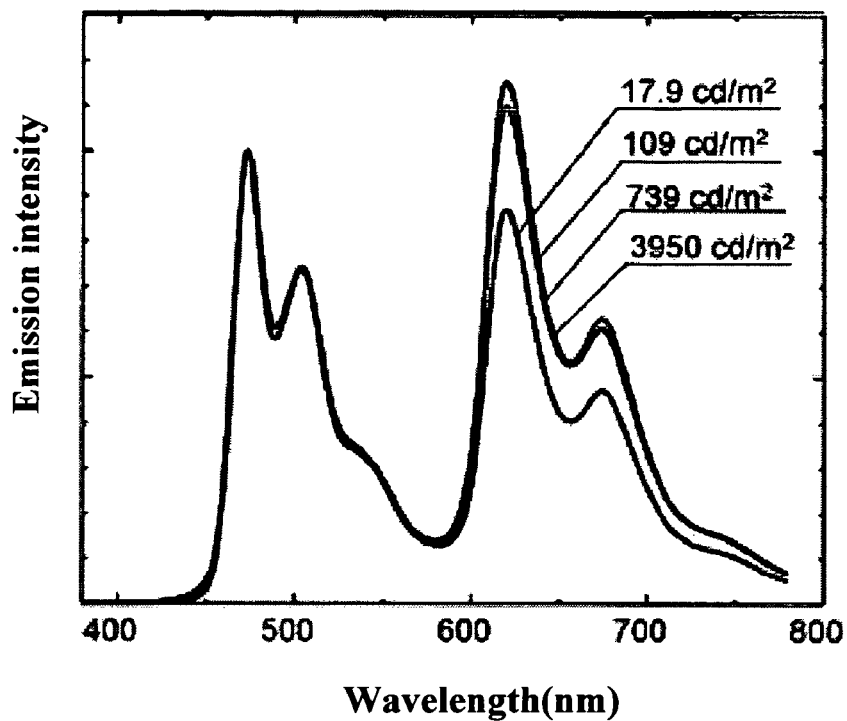
FIG. 2A (related art) shows the electroluminescence (EL) spectra of a conventional white light OELD with two-element structure.
Figure 2B:
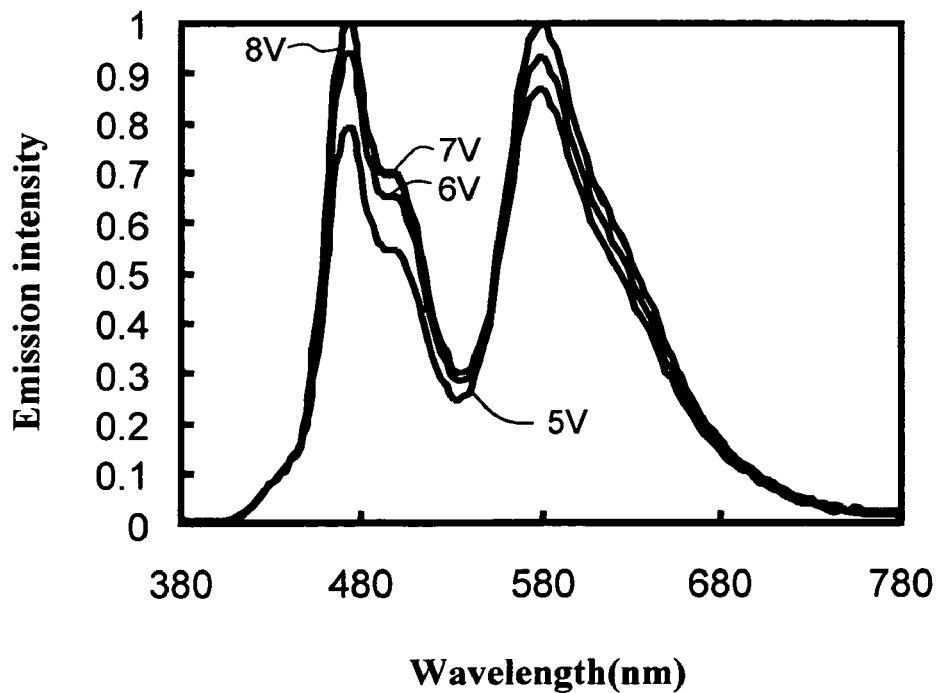
FIG. 2B (related art) shows the electroluminescence (EL) spectra of a conventional white light OELD with three-element structure.
Figure 3:
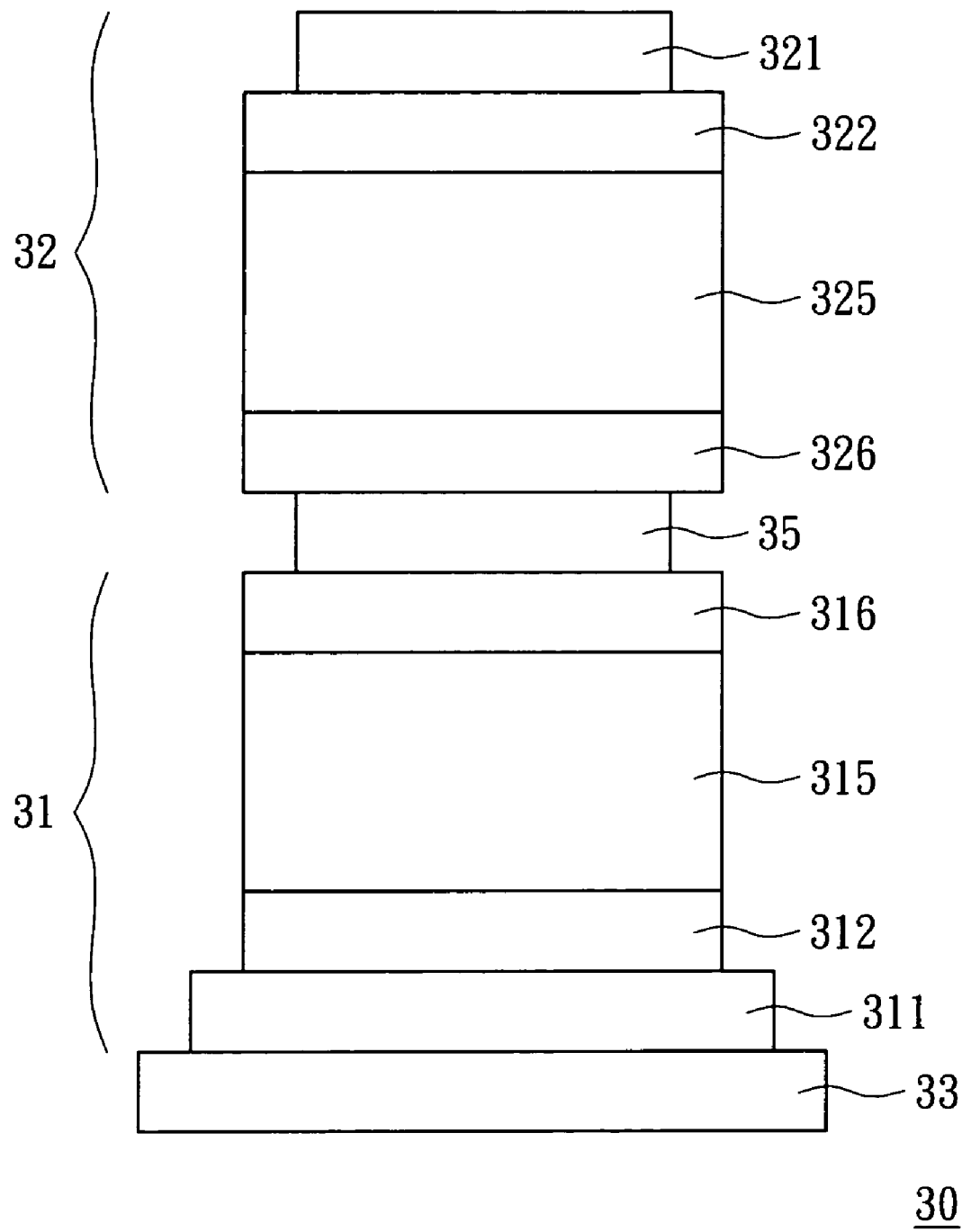
FIG. 3 schematically illustrates a serially connected organic electroluminescence device (SC-OELD) according to the embodiment of the present invention.

FIG. 3 schematically illustrates a serially connected organic electroluminescence device (SC-OELD) according to the embodiment of the present invention. The SC-OELD 30 comprises the first OELD unit 31, the second OELD unit 32 and a connecting layer 35 for connecting the first OELD unit 31 and second OELD unit 32.

The first OELD unit 31 comprises an anode (formed on a substrate 33) 311, a first hole transport layer (HTL) 312, a first light emitting layer 315, and a first electron transport layer (ETL) 316. Optionally, a hole injection layer (HIL) (not shown) could be disposed between the anode 311 and the first HTL 312. An electron injection layer (EIL) (not shown) could be disposed between the first ETL 316 and the connecting layer 35. Also, the anode 311 and the first HTL 312 (and the HIL if existed in the first OELD unit 31) are so called as a first hole-generating source. The first ETL 316 (and the EIL if existed in the first OELD unit 31) is(are) so called as a first electron-generating source. Thus, the first light emitting layer 315 is disposed between the first hole-generating source and the first electron-generating source. The first light emitting layer 315 comprises a host material doped with a phosphorescent (R, G or B) dopant, or comprises several stacked layers able to yield light, wherein light yielded from the stacked layers could be substantially the same or different colors.

Similarly, the second OELD unit 32 comprises a cathode 321, a second electron transport layer (ETL) 322, a second light emitting layer 325, and a second hole transport layer (HTL) 326. Optionally, an electron injection layer (EIL) (not shown) could be disposed between the second ETL 322 and the cathode 321. A hole injection layer (HIL) (not shown) could be disposed between the connecting layer 35 and the second HTL 326. Also, the second ETL 322 and the cathode 321 (and the EIL if existed in the second OELD unit 32) are so called as a second electron-generating source. The second HTL 326 (and the HIL if existed in the second OELD unit 32) is (are) so called as a second hole-generating source. Thus, the second light emitting layer 325 is disposed between the second hole-generating source and the second electron-generating source. The second light emitting layer 325 comprises a host material doped with a phosphorescent (R, G or B) dopant, or comprises several stacked layers able to yield light, wherein light yielded from the stacked layers could be substantially the same or different colors.

Figure 4:
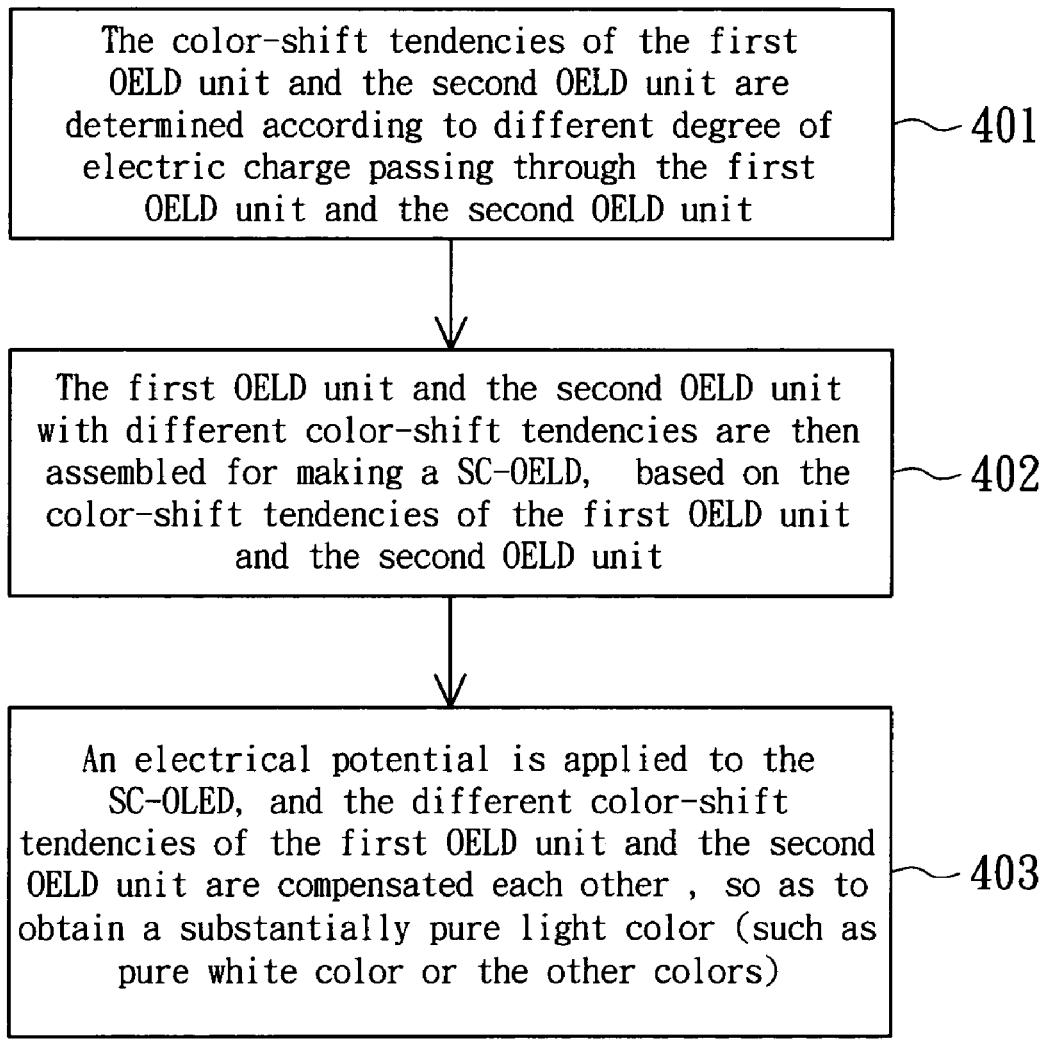
FIG. 4 shows procedure of the method for improving color-shift of the serially connected organic electroluminescent device according to the embodiment of the present invention.

FIG. 4 shows procedure of the method for improving color-shift of the serially connected organic electroluminescent device according to the embodiment of the present invention. First, the color-shift tendencies of the first OELD unit and the second OELD unit are determined according to different degree of electric charge passing through the first OELD unit and the second OELD unit, as depicted in the step 401. It is of course understood that several OELDs having distinct structures (e.g. different compositions of the light emitting layer) are designed and made for being the first OELD unit and the second OELD unit before determining the color-shift tendencies.

In the step 402, the first OELD unit and the second OELD unit with different color-shift tendencies are then assembled. The assembling rule is based on the color-shift tendencies of the first OELD unit and the second OELD unit. Practically, the colorimetric values of any possible combinations from all the designed OELDs should be acquired first. It is desirable that white light emitted by the assembled OELDs have 1931 Commission International d'Eclairage (CIE) chromaticity coordinates, (CIEx, CIEy), of about (0.33, 0.33). Preferably, the coordinate shifted within about 0.03 is the allowable color-shift error (i.e. each of CIEx and CIEy ranged from about 0.30 to 0.36). Typically, the assembled OELD possesses better color balance if it has chromaticity coordinates, (CIEx, CIEy), closer to (0.33, 0.33).

Then, an electrical potential is applied to the SC-OELD having the first OELD unit and the second OELD unit with different color-shift tendencies. The different color-shift tendencies of the first OELD unit and the second OELD unit are compensated each other, so as to obtain a substantially pure color of the SC-OELD (such as pure white color or the other colors).

It is noted that the method described above can be applied for making a SC-OELD emitting any other colors. For example, an OELD emitting orange-red light could be combined with the other OELD having different color-shift tendency, for making a SC-OELD emitting a substantially pure red light. This method is also applicable to make a SC-OELD emitting the light of substantially pure green, blue or other color.

A practical example is further disclosed below for clearly describing the steps of the method of the present invention in detail.

Example

The structure of serially connected organic electroluminescence device (SC-OELD) is referred to FIG. 3. First, several white light OELDs having distinct structures (e.g. different compositions of the light emitting layer) are constructed. When an electrical potential is applied, some of those OELDs present strong emission intensity at the shorter wavelength, and others present strong emission intensity at the longer wavelength. The variations from the standard value of (0.33, 0.33), indexed by chromaticity coordinates (CIEx, CIEy), for example, are more than 0.03, while the applied electrical potential is in the range of 3V to 8V. Then, color-shift tendencies of those distinct OELDs are determined individually by a proper method, such as the measurement of current passing through the OELDs.

After the proper measurement, those OELDs could be divided into two groups according to color-shift tendencies. One OELD group showing stronger color-shift tendency to the longer wavelength is so called as a long wavelength OELD group (e.g. a "red-shift OELD" group). The other OELD group showing stronger color-shift tendency to the shorter wavelength is so called as a short wavelength OELD group (e.g. a "blue-shift OELD" group).

Next, two OELDs from different OELD groups are combined as a SC-OELD, and the color-shift tendency of this SC-OELD is measured. For example, one OELD selected from the "red-shift OELD" group (i.e. the long wavelength OELD group) is combined with one OELD selected from the "blue-shift OELD" group (i.e. the short wavelength OELD group). Any possible combinations of the "red-shift OELD" group and the "blue-shift OELD" group have to be measured to obtain the color-shift tendencies of all the combined SC-OELDs, respectively.

Finally, according to the color-shift tendencies, a combined SC-OELD capable of emitting light with a substantially pure color can be selected from all of the possible combined SC-OELDs, and be the SC-OELD 30 of FIG. 3. That means, the two OELDs of this combined SC-OELD (selected from the "red-shift OELD" group and the "blue-shift OELD" group) could be operated as the first OELD unit 31 and the second OELD unit 32 of FIG. 3.

The SC-OELD fabricated according to the aforementioned method comprises a first OELD unit and a second OELD unit serially connected by a connecting layer, and is capable of generating a substantially pure white light. For example, when a low electrical potential is applied to the SC-OELD, light generated from the first OELD unit is adapted to generate slightly blue white light (i.e. slightly blue white light is emitted from the first OELD unit), and light generated from the second OELD unit is adapted to generate slightly yellow white light (i.e. slightly yellow white light is emitted from the second OELD unit); thus, the light presents a substantial white color after the color-shift tendencies of the first and second OELDs are compensated each other, and the SC-OELD has a color shift of preferably less than (0.03, 0.03), indexed by chromaticity coordinates (CIEx, CIEy). Similarly, when a high electrical potential is applied to this SC-OELD, light generated from the first OELD unit is adapted to generate slightly yellow white light (i.e. slightly yellow white light is emitted from the first OELD unit), and light generated from the second OELD unit is adapted to generate slightly blue white light (i.e. slightly blue white light is emitted from the second OELD unit); thus, the light presents a substantial white color, and the color shift indexed by chromaticity coordinates (CIEx, CIEy) is preferably less than (0.03, 0.03).

According to the embodiment disclosed above, the SC-OELD comprising two OELDs is used for the illustration. However, it is understood that three or more OELDs can be used for constructing the SC-OELD of the present invention, if light generated from the SC-OELD presents a substantial pure color due to the successful color compensation.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for improving color-shift of a serially connected organic electroluminescent device (SC-OELD), the SC-OELD including a first OELD unit, a second OELD unit and a connecting layer disposed between the first and the second OELD units, the method comprising the steps of:
   determining the color-shift tendencies of the first OELD unit and the second OELD unit, respectively, according to different degrees of the electric charge passing through the first OELD unit and the second OELD unit;
   combining the first OELD unit and the second OELD unit with the different color-shift tendencies according to the color-shift tendencies of the first OELD unit and the second OELD unit, wherein light generated by the first OELD unit is blue-white light and light generated by the second OELD unit is yellow-white light when a low electrical potential is applied to the SC-OELD;
   whereby the different color-shift tendencies of the first OELD unit and the second OELD unit are compensated by each other while the electric charge is applied to the SC-OELD and the SC-OELD has a color shift of less than (0.03, 0.03) indexed by chromaticity coordinates (CIEx, CIEv), so as to obtain a pure color of the SC-OELD.

2. The method of claim 1, wherein light generated by the SC-OELD is white light.

3. The method of claim 1, wherein at least one of the first OELD unit and the second OELD unit comprises a hole-generating source, an electron-generating source and a light emitting layer disposed between the hole-generating source and the electron-generating source, and the light emitting layer comprises a host material doped with a phosphorescent dopant.

4. The method of claim 1, wherein at least one of the first OELD unit and the second OELD unit comprises a hole-generating source, an electron-generating source and a light emitting layer disposed between the hole-generating source and the electron-generating source, and the light emitting layer comprises one or more laminated layers for yielding light.

5. A method for improving color-shift of a serially connected organic electroluminescent device (SC-OELD) having a plurality of OELDs connected in serial, each OELD having a distinct structure, the method comprising the steps of:
   determining a color-shift tendency of each OELD; and
   selecting two OELDs of the plurality of OELDs in accordance with the color-shift tendency of each OELD, wherein light generated by the first OELD unit is blue-white light and light generated by the second OELD unit is yellow-white light when a low electrical potential is applied to the SC-OELD, and the color-shift tendencies of the selected two OELDs are compensated by each other, so that the selected two OELDs are capable of emitting light with a pure color and the selected two OELDs have a color shift of less than (0.03, 0.03), indexed by chromaticity coordinates (CIEx, CIEy).

6. The method of claim 5, further comprising:
   dividing the plurality of OELDs into two groups including a long wavelength OELD group and a short wavelength OELD group according to the color-shift tendencies.

7. The method of claim 5, further comprising:
   combining one OELD selected from the long wavelength OELD group with another OELD selected from the short wavelength OELD group to form the SC-OELD.

8. The method of claim 5, wherein light generated from the SC-OELD is adapted to generate white light.

9. The method of claim 5, wherein the step of determining the color-shift tendency of each OELD comprises:
   applying different electrical potentials to the OELDs to determine the color-shift tendency of each OELD.

10. The method of claim 5, wherein at least one of the two OELDs comprises a hole-generating source, an electron-generating source and a light emitting layer disposed between the hole-generating source and the electron-generating source, and the light emitting layer comprises a host material doped with a phosphorescent dopant.

11. The method of claim 5, wherein at least one of the two OELDs comprises a hole-generating source, an electron-generating source and a light emitting layer disposed between the hole-generating source and the electron-generating source, and the light emitting layer comprises one or more laminated layers for yielding light.

* * * * *

UNITED STATES PATENT AND TRADEMARK OFFICE
CERTIFICATE OF CORRECTION

PATENT NO. : 7,592,744 B2  Page 1 of 1
APPLICATION NO. : 11/281380
DATED : September 22, 2009
INVENTOR(S) : Chung-Chun Lee It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 978 days.

Signed and Sealed this

Twenty-first Day of September, 2010

David J. Kappos
*Director of the United States Patent and Trademark Office*